United States Patent [19]

Hammer et al.

[11] Patent Number: 5,706,206
[45] Date of Patent: Jan. 6, 1998

[54] METHOD OF EXTRACTING PARASITIC CAPACITANCE VALUES FROM THE PHYSICAL DESIGN OF AN INTEGRATED CIRCUIT

[75] Inventors: Mark E. Hammer, Loveland, Colo.; Philip J. Johnson, Palo Alto, Calif.

[73] Assignee: Hewlett-Packard Co., Palo Alto, Calif.

[21] Appl. No.: 566,248

[22] Filed: Dec. 1, 1995

[51] Int. Cl.$^6$ .............. G06F 17/50; G01R 27/26
[52] U.S. Cl. ............ 364/489; 364/488; 364/490; 364/491; 364/578
[58] Field of Search .................. 364/488–491, 364/578; 437/60, 40; 334/15; 361/283, 323, 328; 324/311; 257/302; 439/608

[56] References Cited

U.S. PATENT DOCUMENTS 5,452,224 9/1995 Smith, Jr. et al. ............... 364/488
5,568,395 10/1996 Huang ............................. 364/489

OTHER PUBLICATIONS

Simsek et al., "Laxter, a new method for extraction of parasitic effects from MCM layout", IEEE, pp. 344–347, Apr. 1994.

Gannett, "Extending an FET layout verification system to bipolar technology", IEEE, Proceedings of 1988 Bipolar Circuits and Technology Meeting, pp. 183–186, Sep. 12, 1988.

Chang, "Analytical IC Metal–Line Capacitance Formulas", IEEE Transactions on Microwave Theory and Techniques, pp. 608–611, Sep. 1976.

Chung et al., "3–D Interconnect Capacitance Calculation for Multi-conductor and its Application to a ROM Circuit Design", Proceedings of Fifth Annual IEEE International ASIC Conference and Exhibit, pp. 475–478, Sep. 21, 1992.

Ruehli et al., "Efficient Capacitance Calculations for Three-Dimensional Multiconductor Systems", IEEE Transactions on Microwave Theory and Techniques, vol. MTT-21, No. 2, pp. 76–82, Feb. 1973.

*Primary Examiner*—Kevin J. Teska
*Assistant Examiner*—Phallaka Kik

[57] ABSTRACT

A method of extracting parasitic capacitance values from the physical design of an integrated circuit, and more particularly, to a method of extracting lateral coupling and fringing capacitance values from the physical design of an integrated circuit, wherein the integrated circuit comprises multiple layers of conductors, each conductor having one or more lateral edges. The method comprises the steps of identifying each conductor's one or more lateral edges; fragmenting the lateral edges of each conductor into edge fragments based on a number of conductors present in layers above and/or below a given lateral edge; identifying the edge fragments which are laterally adjacent to each edge fragment; computing one or more relationships between an edge fragment and each of its laterally adjacent edge fragments; retrieving parasitic capacitance data for each edge fragment; and using the retrieved parasitic capacitance data to compute one or more parasitic capacitance values for each edge fragment. Disadvantages of prior methods are overcome in that extracted lateral coupling capacitances are based on the presence of conductors running above and/or below a given lateral conductor edge, and fringing capacitances are based on the spacing between a given lateral conductor edge and a laterally adjacent conductor edge.

20 Claims, 9 Drawing Sheets

| PARASITIC CAPACITANCE DATA FOR EDGE FRAGMENT CONDUCTOR SEQUENCE: METAL 2, METAL 1, POLY | | | | | | | | | | | | | | | | | |
|---|---|---|---|---|---|---|---|---|---|---|---|---|---|---|---|---|---|
| SPACE | 0.80 | 1.00 | 1.10 | 1.20 | 1.30 | 1.40 | 1.50 | 1.60 | 1.80 | 2.00 | 2.50 |
| AREA | 8.13 | 9.67 | 10.33 | 10.99 | 11.55 | 12.10 | 12.49 | 12.88 | 13.66 | 14.43 | 15.32 |
| LATERAL COUPLING | 30.88 | 23.73 | 21.10 | 18.46 | 16.47 | 14.49 | 13.27 | 12.05 | 9.62 | 7.18 | 4.74 |
| FRINGING | 14.47 | 17.00 | 18.06 | 19.13 | 20.01 | 20.89 | 21.49 | 22.10 | 23.30 | 24.51 | 25.85 |

METHOD OF EXTRACTING PARASITIC CAPACITANCE VALUES FROM THE PHYSICAL DESIGN OF AN INTEGRATED CIRCUIT

BACKGROUND OF THE INVENTION

This invention pertains to a method of extracting parasitic capacitance values from the physical design of an integrated circuit, and more particularly, to a method of extracting lateral coupling and fringing capacitance values from the physical design of an integrated circuit.

An integrated circuit (IC) is a small device containing up to several million electrical components (including transistors, resistors, capacitors and diodes) and their interconnections (usually metal wires). An IC's components and their interconnections (collectively referred to as "conductors") are arranged in layers. Each layer may comprise several thousand conductors. A non-conducting material or dielectric such as silicon dioxide ($SiO_2$) is used to separate both the layers, and the conductors within the layers. Connections from one layer to another are made through "vias" in the dielectric so that all of the conductors may work together to perform a desired function (such as storing data, processing signals, or controlling a device).

Figure 1:
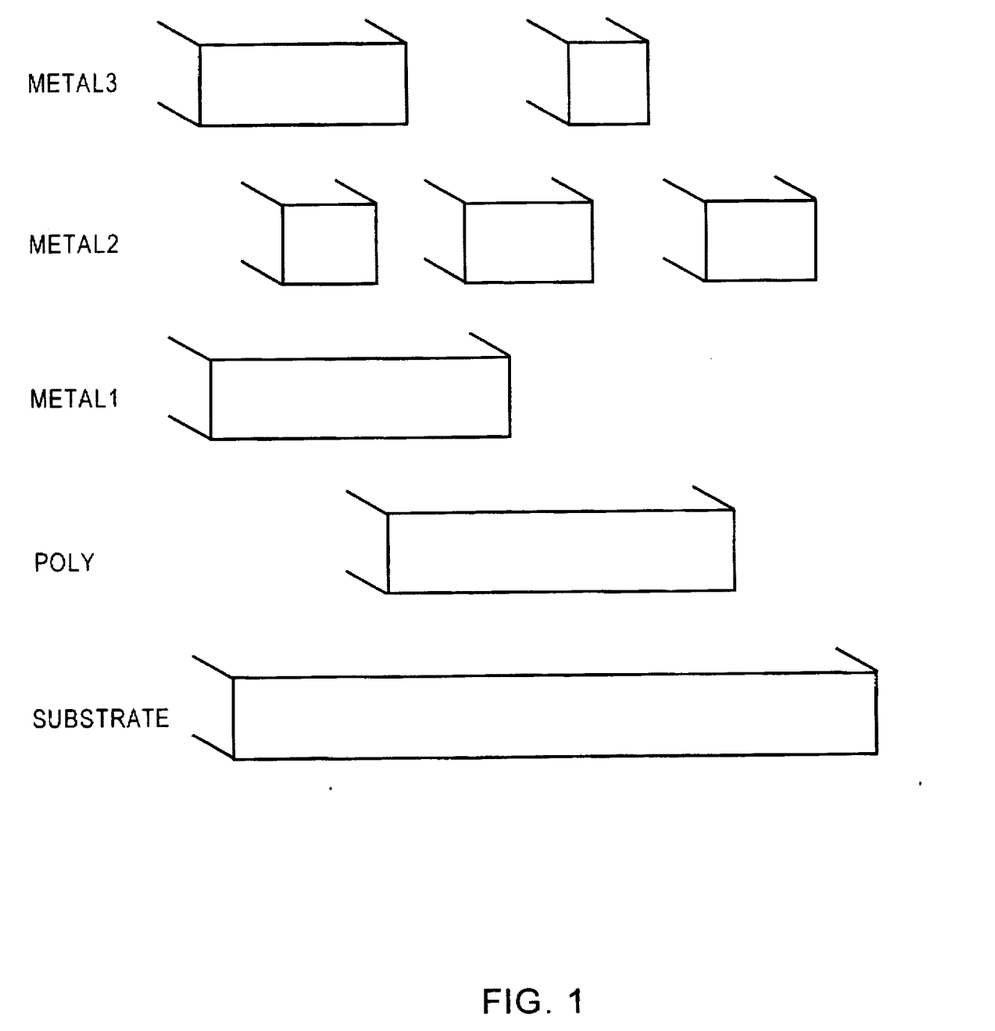
FIG. 1 is a cross sectional view of several IC conductor layers, and the conductor traces therein.

A typical IC cross section is shown in FIG. 1. Note that the IC shown comprises five layers of conductors. The bottom two layers, Substrate and Poly (short for polysilicon), are the building blocks of the IC's transistors. The layers above Poly (Metal 1, Metal 2, and Metal 3) comprise the wires and other conductors which connect the transistors found in the lower layers.

Given that the cross section of the rightmost METAL3 conductor of FIG. 1 has approximate dimensions of 1 μm×1 μm, it can be appreciated that the conductors of an IC are very small, and very closely spaced.

The close spacing of conductors in FIG. 1 leads to a phenomenon called parasitic capacitance. Capacitance is a natural phenomenon which exists between any two conductors which are not electrically connected to each other; the closer the proximity of the conductors, the larger the capacitance. Parasitic capacitance is so named because it is an undesirable effect resulting from the very close proximity of conductors in an IC. As shown in the IC cross section of FIG. 2, parasitic capacitance (represented by the curved lines between the conductors) is significant between all conductors which are in close proximity to one another.

Figure 3:
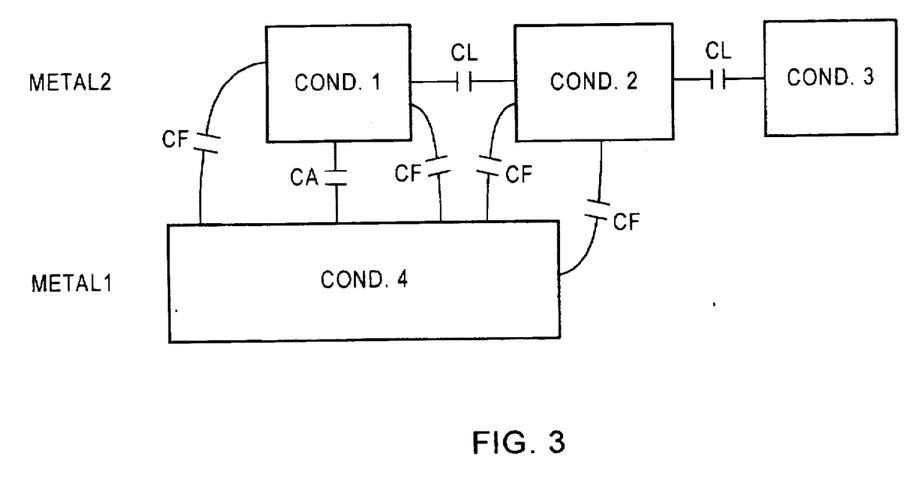
FIG. 3 is a cross sectional view of two FIG. 1 conductor layers, as in FIG. 2, wherein parasitic capacitance fields have been modeled as area, fringing and lateral coupling capacitances.

To calculate the parasitic capacitance attributed to an IC conductor, the capacitance may be broken into components and modeled as in FIG. 3. FIG. 3 identifies three components of parasitic capacitance: area capacitance (CA), lateral coupling capacitance (CL), and fringing capacitance (CF).

Area capacitance (also referred to as "parallel-plate" capacitance) is the component of parasitic capacitance existing between the top and bottom surfaces of two overlapping conductors. It is relatively easy to calculate and can be extracted by a number of parasitic capacitance extraction tools.

Lateral coupling capacitance (also referred to as "lateral", "adjacent trace", "near-body", or "interline" capacitance) is the component of parasitic capacitance which exists between adjacent lateral edges of two conductors.

Fringing capacitance (also referred to as "edge" or "perimeter" capacitance) is the component of parasitic capacitance which exists between a lateral edge of a first conductor, and either the top or bottom surface of a second conductor which overlaps the lateral edge of the first conductor. It is essentially a distortion to the area capacitance component caused by fringing effects at a conductor's lateral edges.

An undesirable effect of parasitic capacitance is to slow the propagation of electrical signals through a circuit, thereby reducing the speed at which an IC can function. The larger the parasitic capacitance, the greater the delay a signal will encounter as it travels through a conductor. If the parasitic capacitance components of an IC can be extracted from the IC's physical design, they can be used to estimate the delay for each signal in the circuit, a process known as timing analysis. This information may be used to adjust the physical layout of conductors in an IC, thereby optimizing the performance of the IC's circuits.

In the past, IC conductors were relatively wide and were spaced relatively far apart laterally (side by side within a layer). In such a configuration, lateral coupling capacitance values were small. Fringing capacitance values were almost entirely dependent upon the layers above and/or below a conductor's edges. Lateral coupling capacitance values, and the lateral spacing effect on fringing capacitance values, were on the order of 14% of a circuit's total parasitic capacitance. As a result, these components were often ignored in extracting an IC's parasitic capacitances.

Many changes have occurred in the art of IC fabrication in recent years. IC production has entered the submicron era. Conductors have become smaller in size, and IC fabrication processes allow conductors to be more closely spaced. Furthermore, ICs have become more vertical. They comprise numerous closely packed layers of interconnected elements. The changes in IC fabrication processes have increased the importance of including lateral effects in parasitic capacitance extraction. Parasitic capacitance due to the fringing and lateral coupling components of parasitic capacitance now account for up to 90% of a signal's total parasitic capacitance (area capacitance values have actually decreased due to decreasing conductor widths). Parasitic capacitance has a substantial impact on circuit timing, and consequently, as the largest components of parasitic capacitance, lateral effects can no longer be ignored.

While vertical conductor spacings have decreased slowly, the lateral spacings of conductors have decreased significantly. As a result, there is a change in the manner in which parasitic capacitance must be calculated. Lateral coupling capacitance is dependent on 1) conductor spacing, 2) the length for which two conductors run alongside, and 3) the presence of other conductors on layers above and/or below a given lateral edge. Lateral coupling capacitance can vary by as much as 50% based on the conductors running above and/or below a given lateral edge. As lateral coupling capacitance has become a large fraction of the total parasitic capacitance, this variation has become a significant factor which must be accounted for in extracting an accurate parasitic capacitance from the physical design of an IC. Fringing capacitance is dependent on 1) the spacing and degree of overlap between two conductors on different layers, and 2) the lateral spacing of conductors in a single layer.

Figure 2:
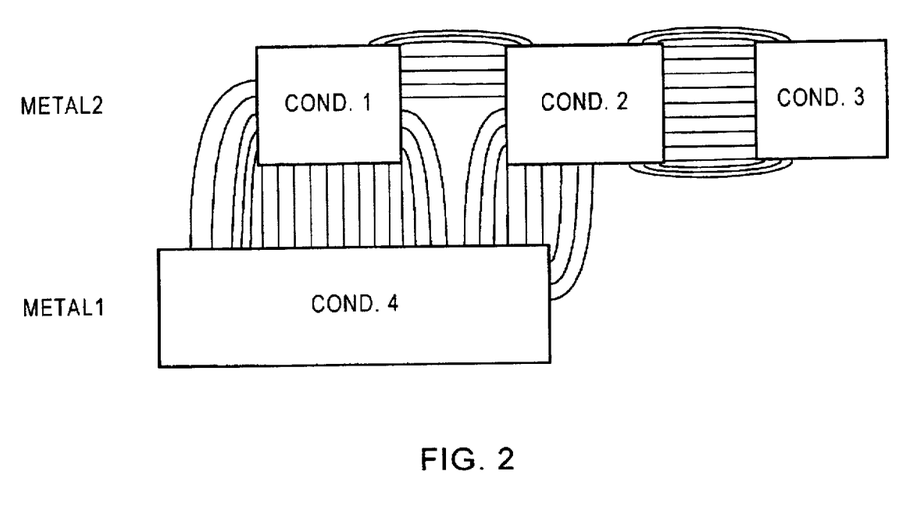
FIG. 2 is an exploded cross sectional view of two FIG. 1 conductor layers, wherein parasitic capacitance field lines have been added.

The dependencies of lateral coupling and fringing capacitances are illustrated in FIG. 2 of the drawings. Note that the fringing capacitance component between the rightmost edge of Conductor 1 (COND. 1) and the top surface of Conductor 4 (COND. 4) is significantly less than the fringing capacitance component between the leftmost edge of Conductor 1 and the top surface of Conductor 4. This is due to the close proximity of Conductor 2 (COND. 2) to the rightmost lateral edge of Conductor 1. Likewise, the lateral coupling capacitance component between Conductors 2 and 1 is significantly less than the lateral coupling capacitance component between Conductors 2 and 3 (COND. 3). This is due to the close proximity of Conductor 4 to the leftmost lateral edge of Conductor 2.

Existing parasitic capacitance extraction tools have been unable to efficiently extract accurate lateral coupling and fringing capacitance values from the physical design of an IC. Analysis tools that are capable of any extraction have two primary disadvantages. First, in an effort to increase the operating speed of an extraction tool, many parasitic extraction methods are based on the simple, "roomy" designs of early ICs. These tools do not implement extraction based on the lateral effects identified in the above paragraph. Consequently, these tools extract parasitic capacitance values which are far from accurate, and are of little help in analyzing circuit timing problems. Second, more accurate extraction tools (those based on two and three-dimensional analysis) individually extract every parasitic capacitance value. Although these tools provide a great deal of accuracy, they are so slow that they may only be used in conjunction with a handful of conductors.

It is therefore a primary object of this invention to present a new and efficient computer implemented method of extracting parasitic capacitance values from the physical design of an IC.

It is a further object of this invention to present a method of extracting lateral coupling capacitance values which are dependent upon the conductors running above and/or below a given lateral conductor edge.

It is an additional object of this invention to present a method of extracting fringing capacitance values which are dependent upon conductors laterally adjacent to a given lateral conductor edge.

It is also an object of this invention to present a method which yields a more accurate modeling of the parasitic capacitance values associated with an IC.

It is a further object of this invention to present a method which provides a better foundation for the effective operation of IC timing analysis, optimization, simulation, design, layout, and other testing tools.

It is yet another object of this invention to present a method which balances accuracy and speed in the extraction of parasitic capacitance values.

SUMMARY OF THE INVENTION

In the achievement of the foregoing objects, the inventors have devised a method, to be implemented in a programmable computer, of extracting parasitic capacitance values from the physical design of an integrated circuit comprising multiple layers of conductors. The method comprises the steps of identifying the lateral edges of each conductor; fragmenting the lateral edges of each conductor into edge fragments based on a number of conductors present in layers above and/or below a given lateral edge; identifying the edge fragments which are laterally adjacent to each edge fragment; computing one or more relationships between an edge fragment and each of its laterally adjacent edge fragments; retrieving parasitic capacitance data for each edge fragment; and using the retrieved parasitic capacitance data to compute one or more parasitic capacitance values for each edge fragment.

Disadvantages of prior methods are overcome in that the above method contemplates lateral effects of parasitic capacitance (i.e., lateral coupling capacitances based on the presence of conductors running above and/or below a given lateral conductor edge, and fringing capacitances based on the lateral spacing between adjacent lateral edges of two conductors).

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

The drawings and this description, in general, disclose a method of extracting parasitic capacitance values from the physical design of an integrated circuit (IC) comprising multiple layers of conductors. The method includes the step of identifying one or more lateral edges of each conductor in the IC 58, and then fragmenting the identified lateral edges into edge fragments based on a number of conductors present in layers above and/or below a given lateral edge 60. The edge fragments which are laterally adjacent to each edge fragment are identified 62. One or more relationships between an edge fragment and each of its laterally adjacent edge fragments are computed 64, 66. Parasitic capacitance data for each edge fragment is retrieved 68 and used to compute one or more parasitic capacitance values for each edge fragment 70. The method may be implemented in a special purpose programmable computer 72, or stored as code in a physical storage media 74 capable of programming a computer 72.

Having thus described the method in general, the method will now be described in further detail.

Every conductor in an IC comprises lateral edges, a top surface, and a bottom surface. Adjacent lateral edges are lateral edges, either on the same layer or on adjacent layers, which face one another and are separated by nothing more than a space (a gap, or a dielectric). While adequate methods of extracting area capacitance values currently exist, adequate methods of extracting lateral coupling and fringing capacitance values for the large number of conductors on an IC do not.

The method for extracting parasitic capacitance values (lateral coupling and fringing) is based on three factors. These factors are 1) the spacing between adjacent lateral edges of two conductors, 2) the length for which adjacent lateral edges of two conductors run alongside each other, and 3) the presence of conductors above and/or below a conductor's lateral edges. When extracting parasitic capacitance values, values may be extracted for an entire IC, or merely a select cell or region.

Figure 11:
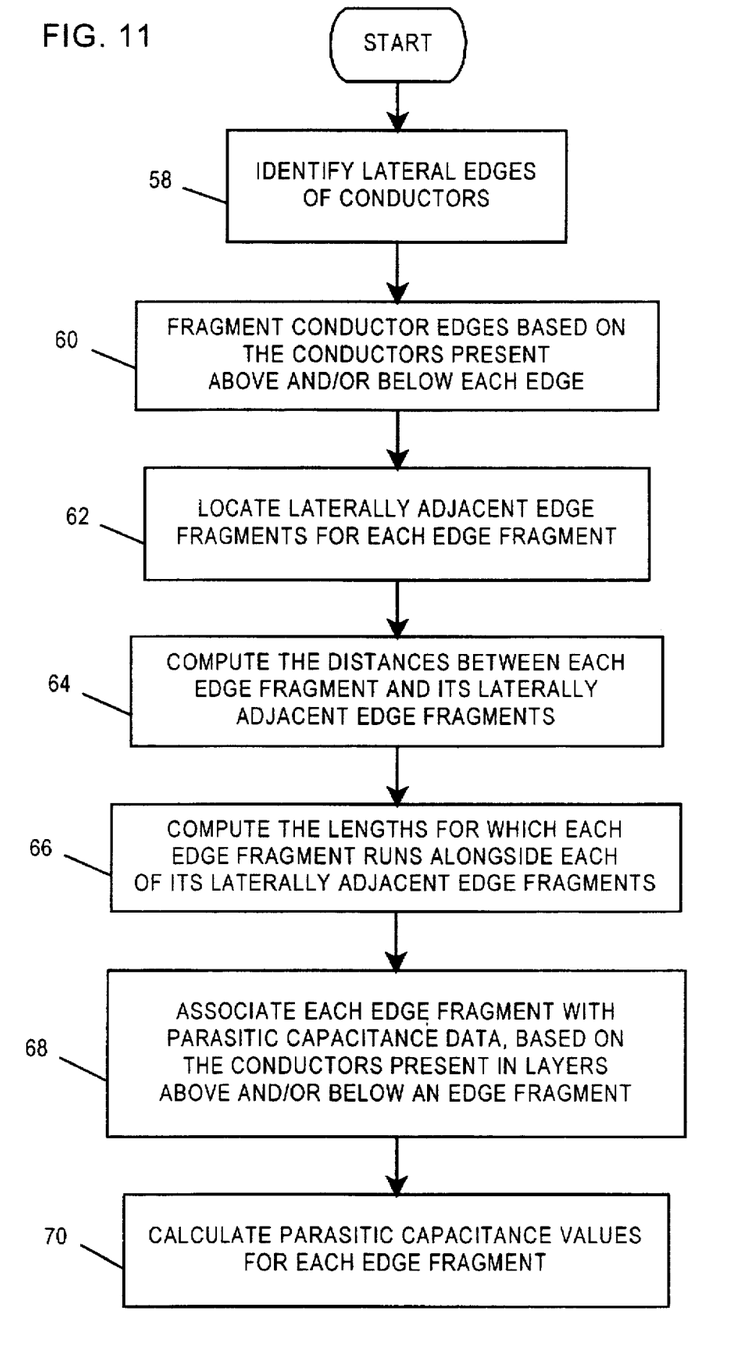
FIG. 11 is a flow chart of possible steps involved in a method of extracting parasitic capacitance values from an IC.

The preferred embodiment of the method (FIG. 11) begins with an identification of all lateral conductor edges in an IC 58. Lateral edges may be identified from the physical design (or "artwork") of an IC and stored in the memory of a computer 72 as geometric coordinates.

Lateral edges are then fragmented into one or more edge fragments based on the presence of conductors running above and/or below a given lateral edge 60. An edge fragment comprises a sequence of conductors, such as: ( . . . upper$_2$, upper$_1$, trace, lower$_1$, lower$_2$ . . . ), where trace represents the conductor comprising the lateral edge to be fragmented. The ". . . upper$_2$, upper$_1$," designations denote the conductors present in the various layers running above the "trace". Likewise, the "lower$_1$, lower$_2$," designations denote the conductors present in the various layers running below the "trace".

Although all of the conductors running above and/or below a given lateral edge can affect the parasitic capacitance attributable to the edge, in the preferred embodiment, the set of conductors identifying a given edge fragment is limited to 1) those conductors which exist immediately above and/or below the given lateral edge, and 2) those conductors which also overlap the given lateral edge (i.e., those conductors that extend over the dielectric between two laterally adjacent edges). A limitation on the number of conductors used to identify an edge fragment limits the number of operations to be performed by a computer 72, and consequently, adds to the method's overall efficiency. Since most, if not all, parasitic capacitance is attributable to conductors immediately above and/or below a lateral edge, or immediately adjacent to an edge, any loss in accuracy is negligible.

Alternatively, a computer 72 can be programmed to only look for those conductors which overlap or lie within a predetermined distance of a given lateral edge—only using conductors within the predetermined distance in identifying edge fragments and/or adjacent edge fragments.

If a conductor on a layer runs above and/or below an edge, but does not overlap the edge, an edge fragment sequence will show that a conductor is absent on that particular layer. In short, if a conductor does not overlap an edge and extend into the gap between two laterally adjacent conductors, it has a negligible affect on parasitic capacitance which for purposes of computational efficiency can be ignored.

Edge fragmentation 60 may be performed using geometric AND and ANDNOT operations. Any time there is a change in the conductors running above and/or below an edge, a new fragment will be created and its geometric coordinates will be stored in memory. Any one lateral conductor edge may comprise many edge fragments, each fragment being stored in memory with a number of data components, including: 1) a pointer to the edge it comprises, and 2) the sequence of conductors comprising the edge fragment. As mentioned above, only the conductors (not layers) immediately above or below an edge have a substantial affect on parasitic capacitance. Thus, in performing edge fragmentation 60, memory may be saved if a new edge fragment is created only when there is a change in the conductor running immediately above or immediately below a given lateral edge.

Figure 4:
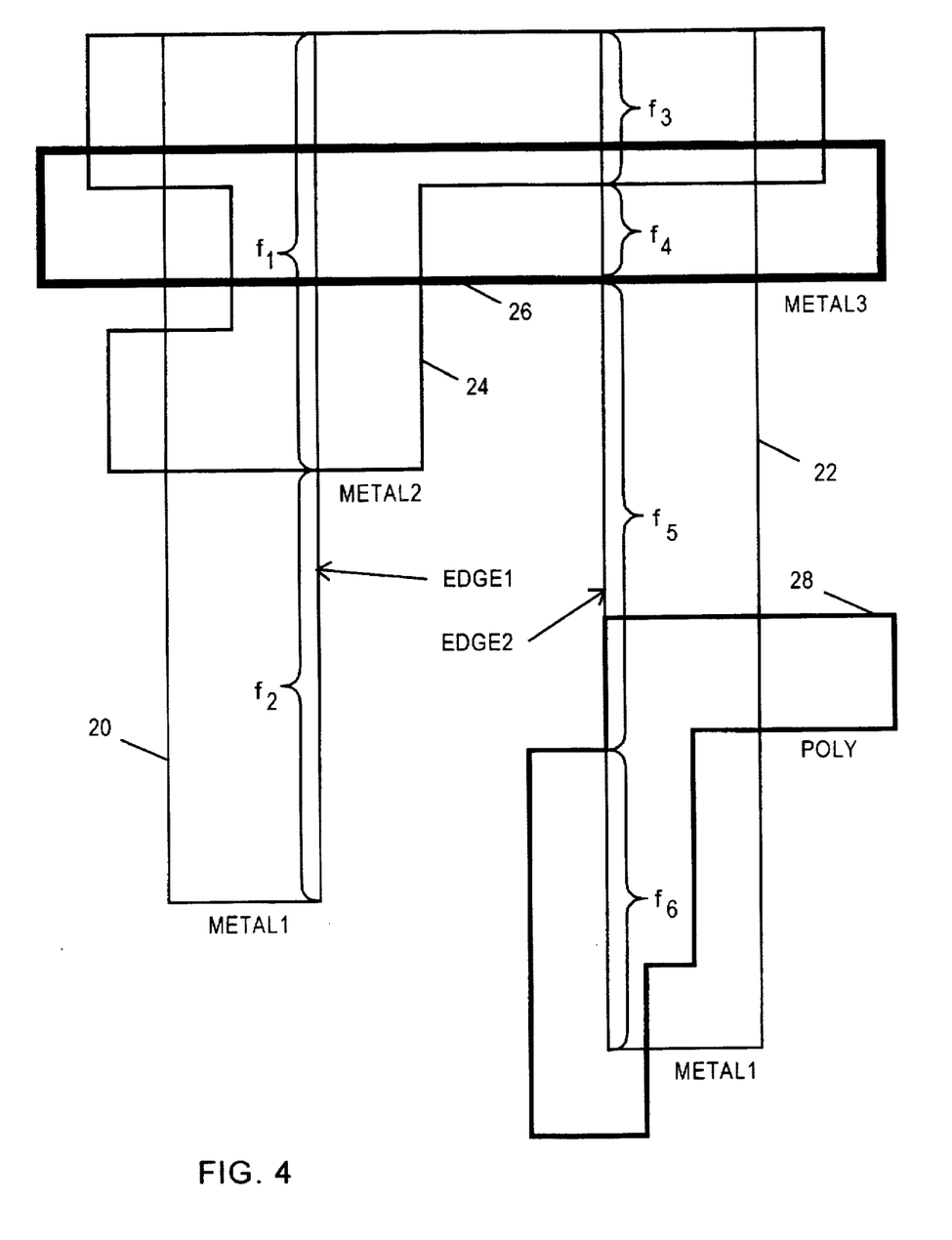
FIG. 4 is a top plan view ("artwork layout" or "physical design") of a number of IC conductor layers running above and/or below one another.
Figure 5:
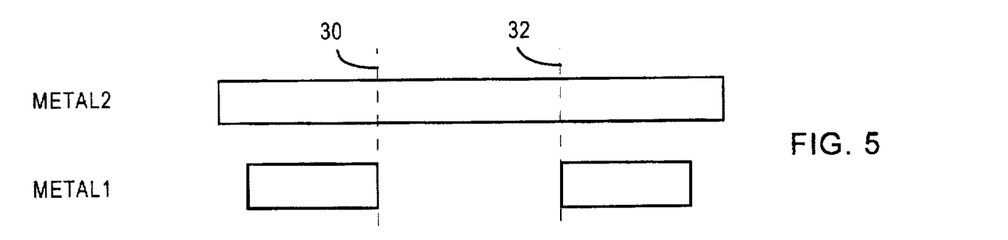
FIG. 5 is a cross sectional view of a first pair of adjacent edge fragments ($f_1$ and $f_3$) identified in FIG. 4.
Figure 6:
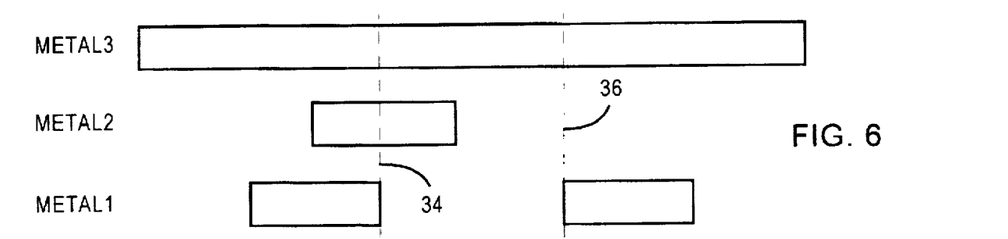
FIG. 6 is a cross sectional view of a second pair of adjacent edge fragments ($f_1$ and $f_4$) identified in FIG. 4.
Figure 7:
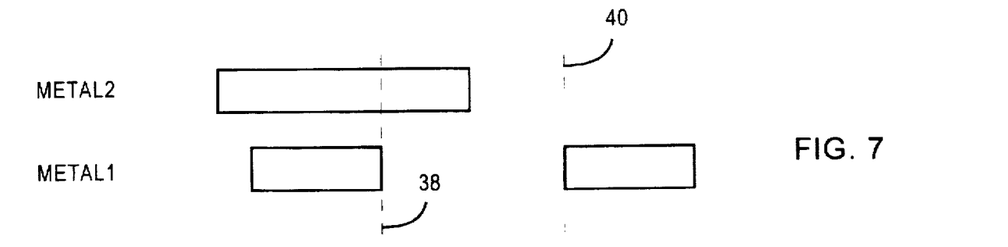
FIG. 7 is a cross sectional view of a third pair of adjacent edge fragments ($f_1$ and $f_5$) identified in FIG. 4.

For example, refer to the IC region shown in FIG. 4. The method begins by identifying the lateral edges of all conductors 58. Although the method would identify several lateral edges in FIG. 4, application of the method will be limited to the laterally adjacent edges (EDGE1 and EDGE2) of the two METAL1 conductors 20, 22. For ease of explanation, it will be assumed that each conductor type (METAL1, POLY, etc.) identifies a particular layer of conductors in the IC, and that the order of the IC's layers, from top to bottom, is: METAL3, METAL2, METAL1, POLY.

After identifying the METAL1 20, 22 lateral edges 58, they must be fragmented into edge fragments 60. EDGE1, on the left side of the gap, will be fragmented into two fragments, denoted as $f_1$ and $f_2$. EDGE2, on the right side of the gap, will be fragmented into four fragments, denoted as $f_3$, $f_4$, $f_5$ and $f_6$. Each fragment will comprise a different sequence of conductors than the fragment or fragments extending from either end of it.

After each of the adjacent METAL1 20, 22 edges has been fragmented, laterally adjacent edge fragments corresponding to each edge fragment are identified 62. Lateral adjacencies are determined through a comparison of the edge fragments' stored geometries. The adjacencies of edge fragments $f_1$ and $f_3$, $f_1$ and $f_4$, $f_1$ and $f_5$, $f_2$ and $f_5$, and $f_2$ and $f_6$ may be identified in FIG. 4, and are respectively shown in the layer cross sections of FIGS. 5–9.

FIGS. 5–9 identify the sequences of conductors identifying the various edge fragments as dashed lines. Thus, the leftmost dashed line 30 in FIG. 5 corresponds to the conductor sequence of edge fragment $f_1$, and the rightmost dashed line 32 in FIG. 5 corresponds to the conductor sequence of edge fragment $f_3$. The conductor sequence of edge fragment $f_1$ is also represented by the leftmost dashed lines 34, 38 of FIGS. 6 and 7. Likewise, the conductor sequence of edge fragment $f_2$ corresponds to the leftmost dashed lines of FIGS. 8 and 9, and the conductor sequences of edge fragments $f_4$, $f_5$ and $f_6$ correspond to the rightmost dashed lines 40, 44, 48 of FIGS. 7–9, respectively. Although METAL3 26 appears in addition to METAL1 20, 22 and METAL2 24 in the leftmost edge type 34 of FIG. 6, the edge fragment is still identified as $f_1$ as long as the only conductors capable of influencing the creation of a new edge fragment are considered to be the conductors running immediately above and/or below an edge. Likewise, the upper portion of the POLY 28 block (FIG. 4) does not create an additional edge fragment between edge fragments $f_5$ and $f_6$, since the upper portion of the POLY 28 block fails to overlap EDGE2.

For each pair of laterally adjacent edge fragments, at least two relationships are computed: 1) the spacing (distance) between the fragments 64, and 2) the length for which the two fragments run alongside each other 66.

Figure 8:
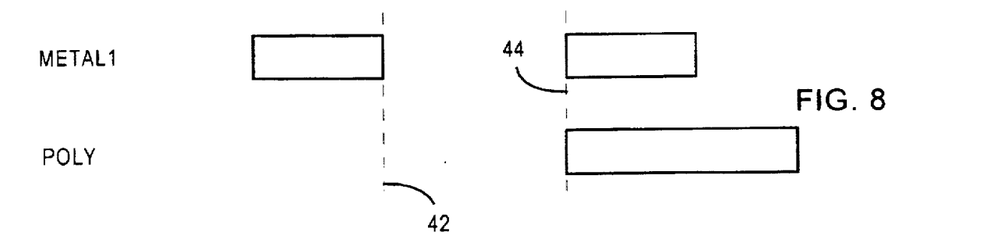
FIG. 8 is a cross sectional view of a fourth pair of adjacent edge fragments ($f_2$ and $f_5$) identified in FIG. 4.
Figure 9:
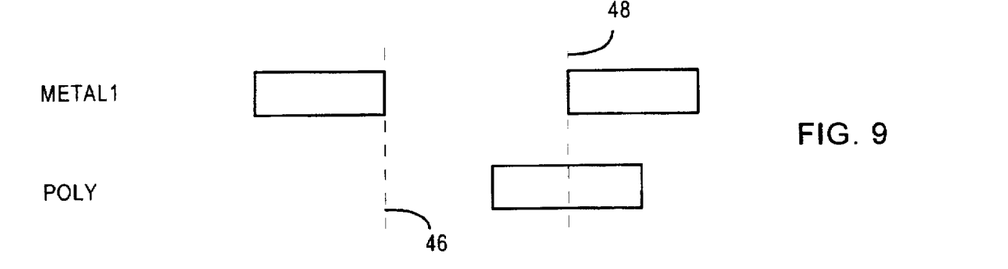
FIG. 9 is a cross sectional view of a fifth pair of adjacent edge fragments ($f_2$ and $f_6$) identified in FIG. 4.

Referring again to FIGS. 4–7, it can be seen that edge fragment $f_1$ is laterally adjacent to edge fragments $f_3$, $f_4$ and $f_5$. Likewise, edge fragment $f_2$ is laterally adjacent to edge fragments $f_5$ and $f_6$ (FIGS. 4, 8 and 9). In the example of FIG. 4, the spacing between the adjacent METAL1 20, 22 edges is uniform. However, this need not be the case.

The lengths for which the various edge fragments run alongside laterally adjacent edge fragments vary. For example, each of edge fragments $f_3$ and $f_4$ run alongside $f_1$ in their entirety. Whereas various lengths of $f_1$ run alongside $f_3$, $f_4$, and $f_5$.

After edges have been fragmented 60, lateral adjacent edge fragments have been identified 62, and one or more relationships between the two have been computed 64, 66, parasitic capacitance data is retrieved for each edge fragment 68. Parasitic capacitance data may be retrieved through a table lookup process. However, the data is preferably generated using a combination of base constants and one or more curve-fitting formulas.

Figure 12:
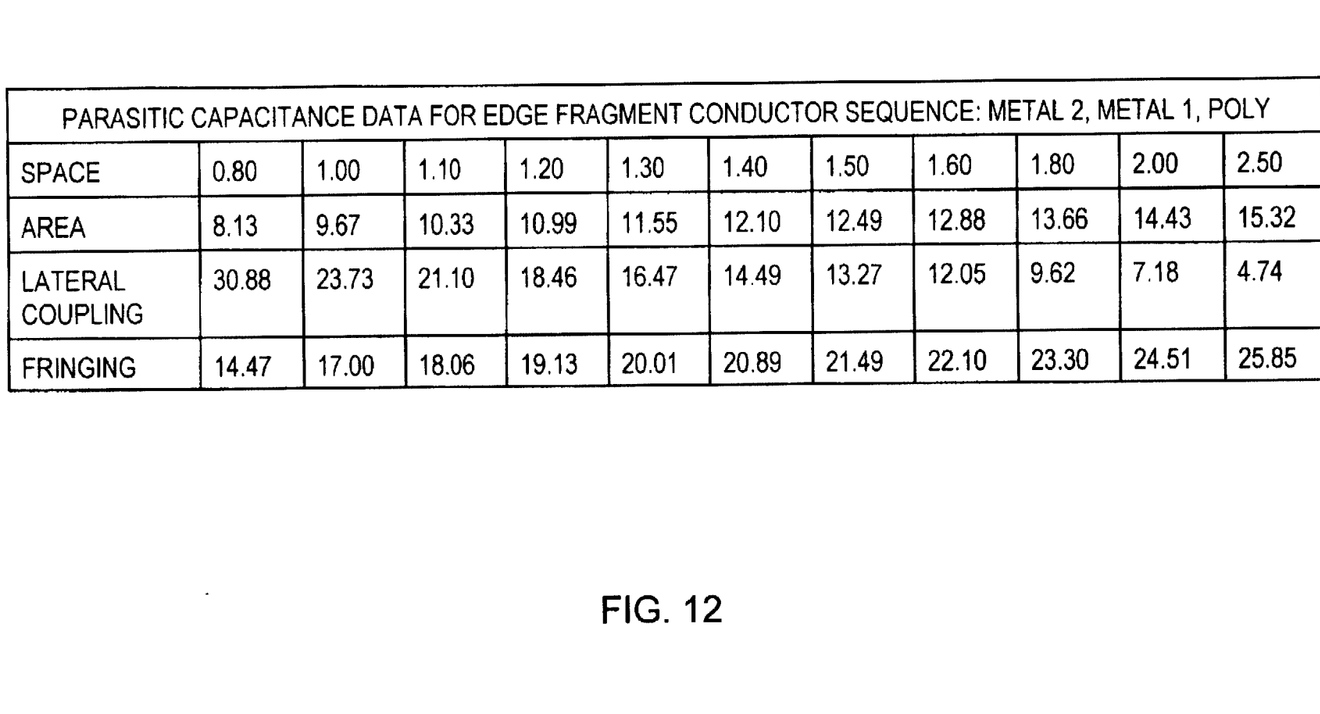
FIG. 12 is a representative portion of a parasitic capacitance data table.

A representative table of parasitic capacitance data is shown in FIG. 12. Such tables correspond to the various edge fragment conductor sequences which may exist in a particular IC process (an IC process dictates the various conductor sizes, conductor spacings and conductor overlap possibilities which are possible within the limitations of a particular IC fabrication process). Each possible edge fragment within an IC process is associated with its own unique table of parasitic capacitance data (all of the tables being similar in form to the one in FIG. 12). Therefore, if an IC process allows for the creation of fifty different edge fragments (differing conductor sequences), a computer 72 extracting parasitic capacitance values from tables must have access to fifty data tables, each similar to the one in FIG. 12. Note that the area, lateral coupling, and fringing capacitance data is based not only on the conductors present in layers above and/or below a given edge fragment, but also on the spacing between an edge fragment and its lateral adjacent edge fragments. Previous parasitic extraction tools calculated lateral coupling capacitance solely as a function of the spacing between laterally adjacent edge fragments, and fringing capacitances solely on the conductors present in layers above and/or below a given edge.

Figure 13:
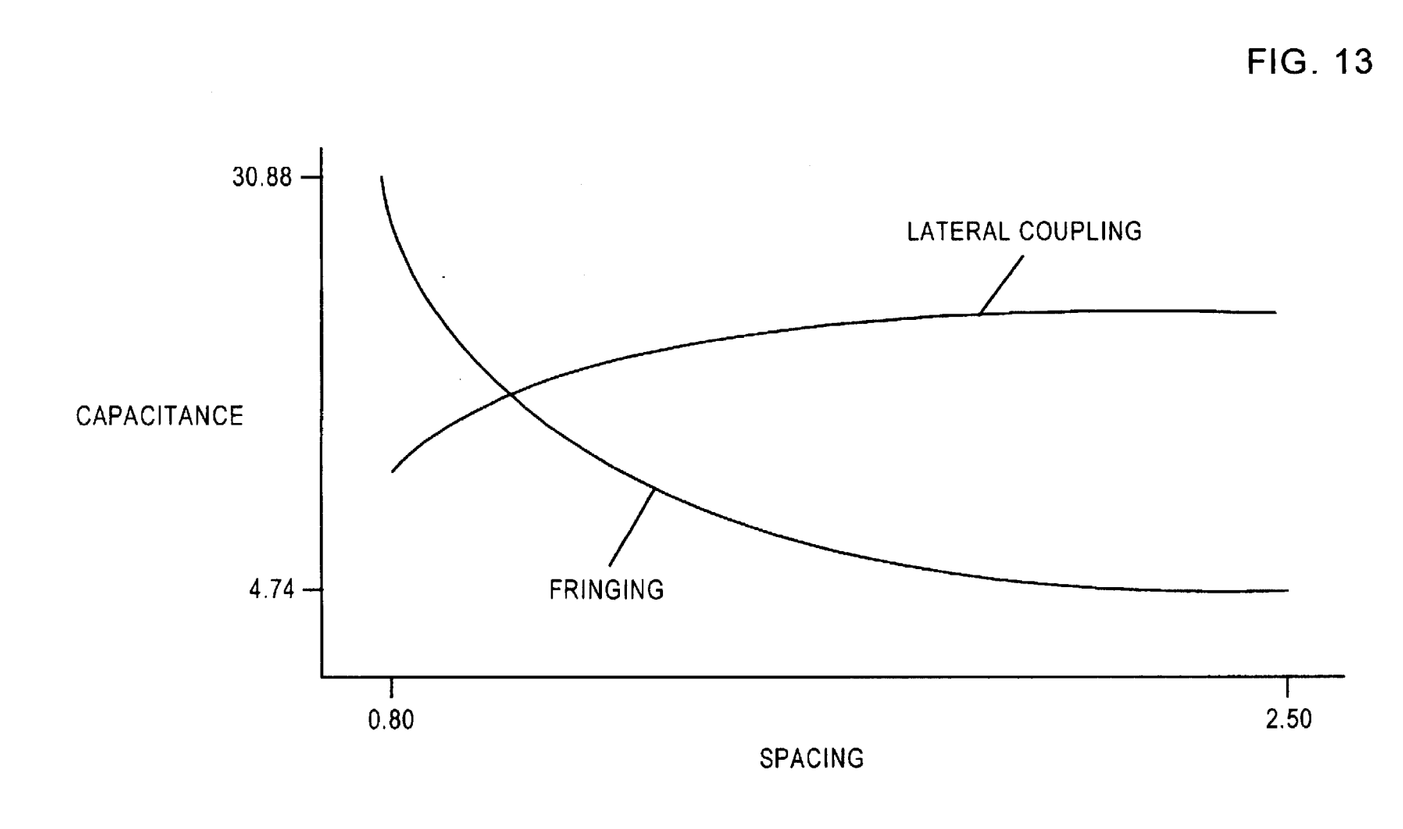
FIG. 13 is a graph of the data contained in the data table of FIG. 12.
Figure 14:
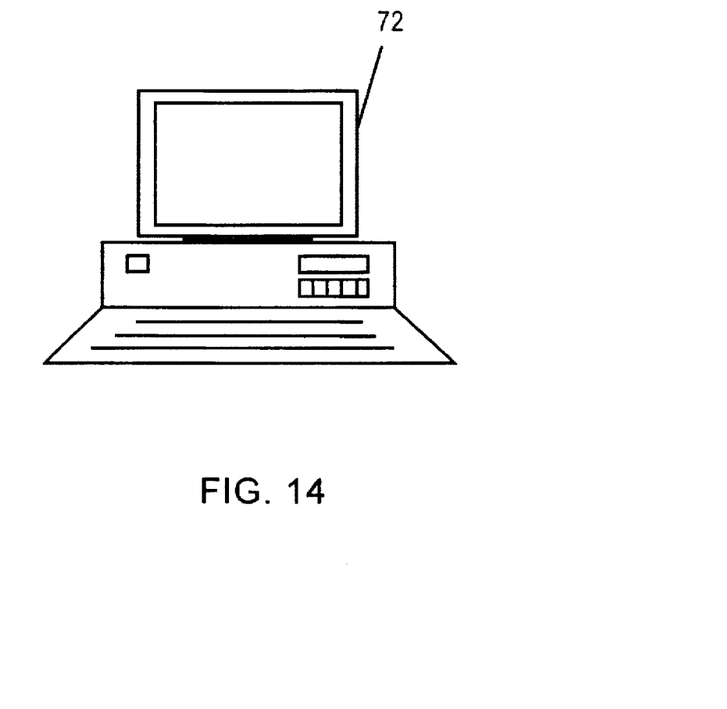
FIG. 14 is a special purpose programmable computer in which the method of FIG. 11 may be implemented.
Figure 15:
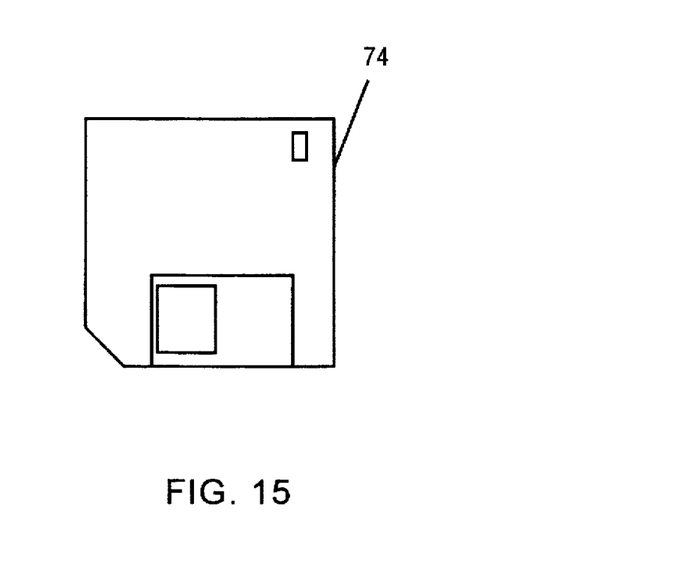
FIG. 15 is a physical storage medium in which a computer program implementing the method of FIG. 11 may be stored.

Preferable to a table lookup method of retrieving parasitic capacitance data is data generation. Parasitic capacitance data can be generated by plugging a small number of base constants corresponding to a given edge fragment into a curve-fitting formula, and then generating the desired parasitic capacitance data. Exponential curve-fitting formulas utilizing non-integer exponents, such as the formula $C = length * B * e^{-space/A}$ (where A and B are constants, "length" is the length for which two laterally adjacent edge fragments run alongside each other, and "space" is the distance between two laterally adjacent edge fragments), can be used to closely approximate the data contained in the parasitic capacitance data tables. See FIG. 13. However, it is often necessary to balance accuracy against computational speed (run-time). If no layer is above or below an edge fragment, the formula $C = (A * length)/(B + space)$ may be used to approximate lines of the parasitic capacitance data table (where A and B are stored constants, "length" is the length for which two laterally adjacent edge fragments run alongside each other, and "space" is the distance between two laterally adjacent edge fragments). If a layer does exist above or below an edge, the formula $C = (A * length)/(B + space^2)$ may be used to approximate table data, where A and B again represent stored constants. If layers are tightly sandwiched, the formula $C = (A * length)/(B + space^3)$ has been useful.

After appropriate parasitic capacitance data is retrieved and/or generated 68, parasitic capacitance values may be computed 70. Lateral coupling and fringing capacitance values are computed for each pair of laterally adjacent edge fragments. In calculating a lateral coupling capacitance between laterally adjacent edges, it is preferred to derive half of the lateral coupling capacitance from each of the laterally adjacent edges. Doing so greatly simplifies computations and allows for the summing of capacitance values in obtaining a total parasitic capacitance attributable to a single conductor. Half of a lateral coupling capacitance is calculated by limiting capacitance calculations to dependency on a single edge. Note that an edge fragment's capacitance values being dependent on its relationships (i.e., spacing and length running alongside) to a laterally adjacent edge fragment is not the same as its capacitance values being dependent on the laterally adjacent edge fragment's conductor sequence. Relationships require a two dimensional analysis, whereas relationships and conductor sequence require a three dimensional analysis. Testing of the method has shown that this simplification yields a tremendous increase in system performance, with only a minimal decrease in accuracy. The advantages of the simplification can be appreciated with the realization that an IC comprising fifty edge fragment conductor sequences could comprise 2,500 types of laterally adjacent edge pairs.

Figure 10:
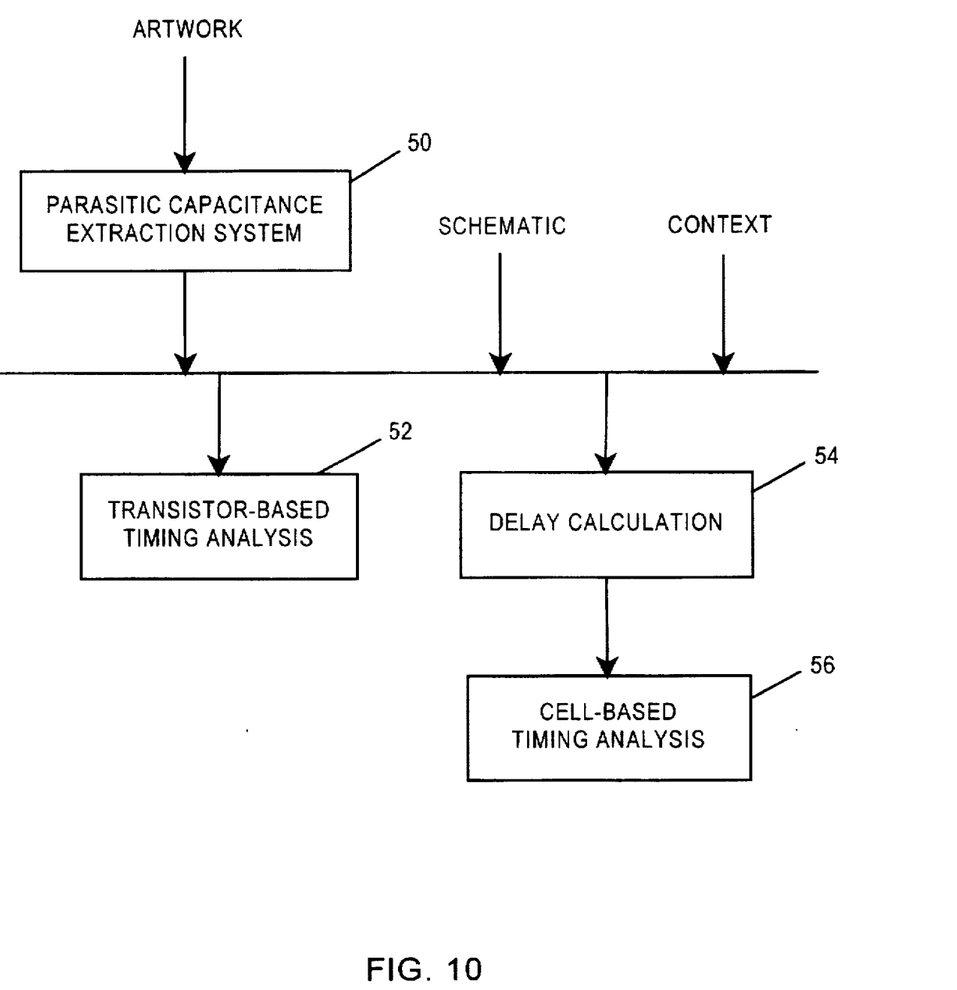
FIG. 10 is a schematic of possible inputs and outputs to a parasitic capacitance extraction system.

FIG. 10 demonstrates how parasitic capacitance extraction 50 fits into the big picture of IC analysis. A computer 72 performing parasitic capacitance extraction requires an IC's artwork (physical design) as an input. The artwork can come form a variety of sources, including, a manual layout, a cell library, routing from standard cell or block routers, a datapath, memory, or pad frame generators. Having only the artwork, parasitic capacitance values may be extracted. The extracted values may be combined with an IC's schematic (transistor-level or gate-level) and context to perform transistor-level timing analysis 52, delay calculations 54, cell-based timing analysis 56, optimization, simulations, and so on.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method of extracting parasitic capacitance values from a physical design of an integrated circuit (IC) comprising multiple layers of conductors, the method comprising the steps of:

a) identifying one or more lateral edges of each conductor in the IC;

b) for each conductor in the IC, fragmenting its lateral edges into edge fragments based on a number of conductors present in layers above and/or below a given lateral edge;

c) for each edge fragment, identifying its laterally adjacent edge fragments;

d) for each edge fragment, computing one or more relationships between it and each of its laterally adjacent edge fragments;

e) retrieving parasitic capacitance data for each edge fragment;

f) using the parasitic capacitance data of step d), computing one or more parasitic capacitance values for each edge fragment.

2. A method as in claim 1, wherein the number of conductors present in layers above and/or below a given lateral edge comprises only those conductors which are immediately above and/or below the given lateral edge.

3. A method as in claim 1, wherein the number of conductors present in layers above and/or below a given lateral edge comprises all of the conductors in the IC which are above and/or below the given lateral edge.

4. A method as in claim 1, wherein the number of conductors present in layers above and/or below a given lateral edge comprises only those conductors which overlap the given lateral edge.

5. A method as in claim 1, wherein the step of computing one or more relationships between each edge fragment and each of its laterally adjacent edge fragments comprises the steps of:
   a) for each edge fragment, computing a distance to each of its laterally adjacent edge fragments; and
   b) for each edge fragment, computing a length for which it runs alongside each of its laterally adjacent edge fragments.

6. A method as in claim 1, wherein:
   a) the step of fragmenting each conductor's lateral edges into edge fragments based on the number of conductors present in layers above and/or below a given lateral edge comprises basing the fragmentation on conductors present in layers above and/or below the given lateral edge which are within a predetermined distance of the given lateral edge; and
   b) the step of identifying each fragment's laterally adjacent edge fragments comprises identifying only those laterally adjacent edge fragments which are within a predetermined distance of the given lateral edge.

7. A method as in claim 1, wherein the step of retrieving parasitic capacitance data for each edge fragment comprises retrieving lateral coupling and fringing capacitance data which is dependent upon:
   i) the number of conductors present in layers above and/or below a given edge fragment, and;
   ii) the one or more relationships computed in step c) of claim 1.

8. A method as in claim 7, wherein the step of retrieving parasitic capacitance data for each edge fragment comprises the step of performing a table lookup operation.

9. A method as in claim 7, wherein the step of retrieving parasitic capacitance data for each edge fragment comprises the step of first generating the parasitic capacitance data using one or more base constants and curve-fitting formulas.

10. A method as in claim 1, wherein the step of computing one or more parasitic capacitance values for each edge fragment comprises the steps of:
    a) for each edge fragment, computing half of a lateral coupling capacitance to each of the edge fragment's laterally adjacent edge fragments; and
    b) for each edge fragment, computing a fringing capacitance to any conductor above and/or below the lateral edge.

11. A method as in claim 10, further comprising the step of summing the one or more parasitic capacitance values computed for each edge fragment of each of the lateral edges of a given IC conductor, thereby extracting a parasitic capacitance associated with the given IC conductor.

12. A method as in claim 7, wherein the step of computing one or more parasitic capacitance values for each edge fragment comprises the steps of:
    a) for each edge fragment, computing half of a lateral coupling capacitance to each of the edge fragment's laterally adjacent edge fragments; and
    b) for each edge fragment, computing a fringing capacitance to any conductor above and/or below the lateral edge.

13. A method as in claim 2, wherein the number of conductor types present in layers above and/or below a given lateral edge further comprises only those conductors which overlap the given lateral edge.

14. A method as in claim 13, wherein the step of computing one or more relationships between each edge fragment and each of its laterally adjacent edge fragments comprises the steps of:
    a) for each edge fragment, computing a distance to each of its laterally adjacent edge fragments; and
    b) for each edge fragment, computing a length for which it runs alongside each of its laterally adjacent edge fragments.

15. A method as in claim 14, wherein the step of retrieving parasitic capacitance data for each edge fragment comprises retrieving lateral coupling and fringing capacitance data which is dependent upon:
    i) the number of conductor types present in layers above and/or below a given edge fragment, and;
    ii) the one or more relationships computed in claim 14.

16. A method as in claim 15, wherein the step of retrieving parasitic capacitance data for each edge fragment comprises the step of first generating the parasitic capacitance data using one or more base constants and curve-fitting formulas.

17. A method as in claim 16, wherein the step of computing one or more parasitic capacitance values for each edge fragment comprises the steps of:
    a) for each edge fragment, computing half of a lateral coupling capacitance to each of the edge fragment's laterally adjacent edge fragments; and
    b) for each edge fragment, computing a fringing capacitance to any conductor above and/or below the lateral edge.

18. A method as in claim 17, further comprising the step of summing the one or more parasitic capacitance values computed for each edge fragment of each of the lateral edges of a given IC conductor, thereby extracting a parasitic capacitance associated with the given IC conductor.

19. A programmable computer for extracting parasitic capacitance values from a physical design of an integrated circuit (IC) comprising multiple layers of conductors, wherein each conductor comprises one or more lateral edges, the computer comprising:
    a) means to fragment the lateral edges of each conductor in the IC into edge fragments based on a number of conductors present in layers above and/or below a given lateral edge;
    b) means to identify the edge fragments which are laterally adjacent to each edge fragment;
    c) means for computing one or more relationships between each fragment and each of its laterally adjacent edge fragments;
    d) means for retrieving parasitic capacitance data for each edge fragment;
    e) means for computing one or more parasitic capacitance values for each edge fragment using the parasitic capacitance data retrieve in step d).

20. A physical storage medium, capable of programming a computer to extract parasitic capacitance values from an integrated circuit (IC) comprising multiple layers of conductors, wherein each conductor comprises one or more lateral edges, the medium comprising:

a) means to fragment the lateral edges of each conductor in the IC into edge fragments based on a number of conductors present in layers above and/or below a given lateral edge;

b) means to identify the edge fragments which are laterally adjacent to each edge fragment;

c) means for computing one or more relationships between each fragment and each of its laterally adjacent edge fragments;

d) means for retrieving parasitic capacitance data for each edge fragment;

e) means for computing one or more parasitic capacitance values for each edge fragment using the parasitic capacitance data retrieve in step d).

* * * * *